(12) United States Patent
Dedoro (10) Patent No.: US 6,953,269 B2
(45) Date of Patent: Oct. 11, 2005

(54) LIGHTING UNIT WITH DISCHARGE LAMPS, PARTICULARLY FOR SPOTLIGHTS AND THE LIKE

(75) Inventor: Bruno Dedoro, Castel Goffredo (IT)

(73) Assignee: Coemar S.p.A., Castel Goffredo (IL)

( * ) Notice: Subject to any disclaimer, the term of this patent is extended or adjusted under 35 U.S.C. 154(b) by 0 days.

(21) Appl. No.: 10/270,367

(22) Filed: Oct. 15, 2002

(65) Prior Publication Data

US 2004/0017686 A1 Jan. 29, 2004

(30) Foreign Application Priority Data

Jul. 23, 2002 (IT) ..................................... MI2002A1626

(51) Int. Cl.[7] ................................................ B60Q 1/06
(52) U.S. Cl. ........................ 362/293; 362/373; 362/294; 362/264
(58) Field of Search ................................. 362/373, 293, 362/294, 264, 2, 5, 18, 263, 265, 269, 345, 276, 802; 353/57, 58, 59, 60, 61

(56) References Cited

U.S. PATENT DOCUMENTS

| | | | |
|---|---|---|---|
| 4,298,806 A | * 11/1981 | Herold | ................... 250/504 H |
| 5,882,107 A | 3/1999 | Bornhorst et al. | |
| 6,227,686 B1 | * 5/2001 | Takahashi et al. | .......... 362/294 |
| 6,241,366 B1 | * 6/2001 | Roman et al. | .............. 362/293 |
| 6,341,879 B1 | 1/2002 | Skinner et al. | |
| 6,588,907 B1 | * 7/2003 | Billington et al. | ............ 353/57 |

FOREIGN PATENT DOCUMENTS

| | | |
|---|---|---|
| DE | 39 23 108 A1 | 2/1990 |
| DE | 43 25 560 A1 | 2/1994 |

* cited by examiner

Primary Examiner—Sandra O'Shea
Assistant Examiner—Bao Q Truong
(74) Attorney, Agent, or Firm—Guido Modiano; Albert Josif; Daniel O'Byrne (57) ABSTRACT

A lighting unit with discharge lamps, particularly for spotlights and the like, including a discharge lamp inside a containment enclosure and ventilation elements for cooling the lamp, a control unit that drives a lamp power supply to supply variable power levels to the lamp and a fan power supply for actuating the ventilation elements at a variable speed. The control unit is controlled by signals imparted from outside and/or by signals that can be derived from measurements taken inside the lighting unit.

8 Claims, 7 Drawing Sheets

LIGHTING UNIT WITH DISCHARGE LAMPS, PARTICULARLY FOR SPOTLIGHTS AND THE LIKE

BACKGROUND OF THE INVENTION

The present invention relates to a lighting unit with discharge lamps, particularly for spotlights and the like.

As is known, spotlights in particular use discharge lamps of very high power in order to project, for example during a show, a harmonized beam of light with variable shapes, colors and positions.

The lamps used in the various constructive versions, when switched on inside the spotlight, generate heat, which must be removed since it would lead to breakage or burning out of the lamp if it were not ventilated adequately.

With normally commercially available lamps, the critical breaking or burning out point of the lamp is the weld at the two mutually opposite electrodes.

The temperature of such welded regions must be between a maximum value and a minimum value, since exceeding the maximum temperature would damage the lamp irreversibly and temperatures below the minimum value would lead to poor operation of the lamps.

Currently commercially available embodiments use ducted air stream fans, which are arranged in various manners so as to convey a stream of air proximate to the regions where the welds of the lamp are provided, so as to achieve the intended cooling.

It should also be noted that the selection of the power level of the fans is particularly critical, since insufficient cooling leads to lamp breakage or burning out but excessive cooling causes poor lamp operation, and therefore it is not possible to utilize the lamp easily at too different power levels, since the fixed ventilation inevitably sets an impassable limit.

SUMMARY OF THE INVENTION

The aim of the invention is indeed to eliminate the drawbacks noted above by providing a lighting unit with discharge lamps, particularly for spotlights and the like, that allows to keep the temperature always constant independently of the various operating conditions and also independently of any insertion of color filters in the light beam, which produce by reflection an additional heating of the region where the lamp is provided.

Within this aim, an object of the invention is to provide a lighting unit that allows to optimize the operation of the lamp in all its operating conditions and also allows to adjust within broad margins the luminous output, with the possibility to optimize the luminous output levels even when color filters are inserted in the beam of light.

Another object of the present invention is to provide a lighting unit that allows optimum control of lamp temperature without negative effects caused by elements located inside the spotlight.

Another object of the present invention is to provide a lighting unit that by virtue of its particular constructive characteristics is capable of giving the greatest assurances of reliability and safety in use.

This aim and these and other objects that will become better apparent hereinafter are achieved by a lighting unit with discharge lamps, particularly for spotlights and the like, which comprises at least one discharge lamp inside a spotlight and at least one ventilation element for cooling said lamp, characterized in that it comprises a control unit that drives a fan power supply in order to actuate said at least one ventilation element at a variable speed, said control unit being controlled by signals imparted from outside and/or by signals that can be derived from measurements taken inside the lighting unit.

BRIEF DESCRIPTION OF THE DRAWINGS

Further characteristics and advantages will become better apparent from the description of a preferred but not exclusive embodiment of a lighting unit with discharge lamps, particularly for spotlights and the like, illustrated only by way of non-limitative example in the accompanying drawings, wherein:

FIG. 9 is a block diagram of a lighting unit with lamp power supply controlled by the color temperature correction filters;

DESCRIPTION OF THE PREFERRED EMBODIMENTS

With reference to the figures, the lighting unit with discharge lamps, particularly for spotlights and the like, generally designated by the reference numeral 1, comprises a discharge lamp 2, which can be- of any kind and is arranged inside a containment enclosure 3, which is placed inside a spotlight so as to guide a light beam, which is then optionally processed for example by the filter units arranged opposite the parabolic reflector 4 arranged at the lamp 2.

In a per se known manner, there are ventilation elements, generally designated by the reference numeral 10, which are provided by means of fans 11 which emit a stream of air which, by way of baffles 12, is directed to the prescribed points of the lamp 2 that must be subjected to the appropriate cooling.

Figure 1:
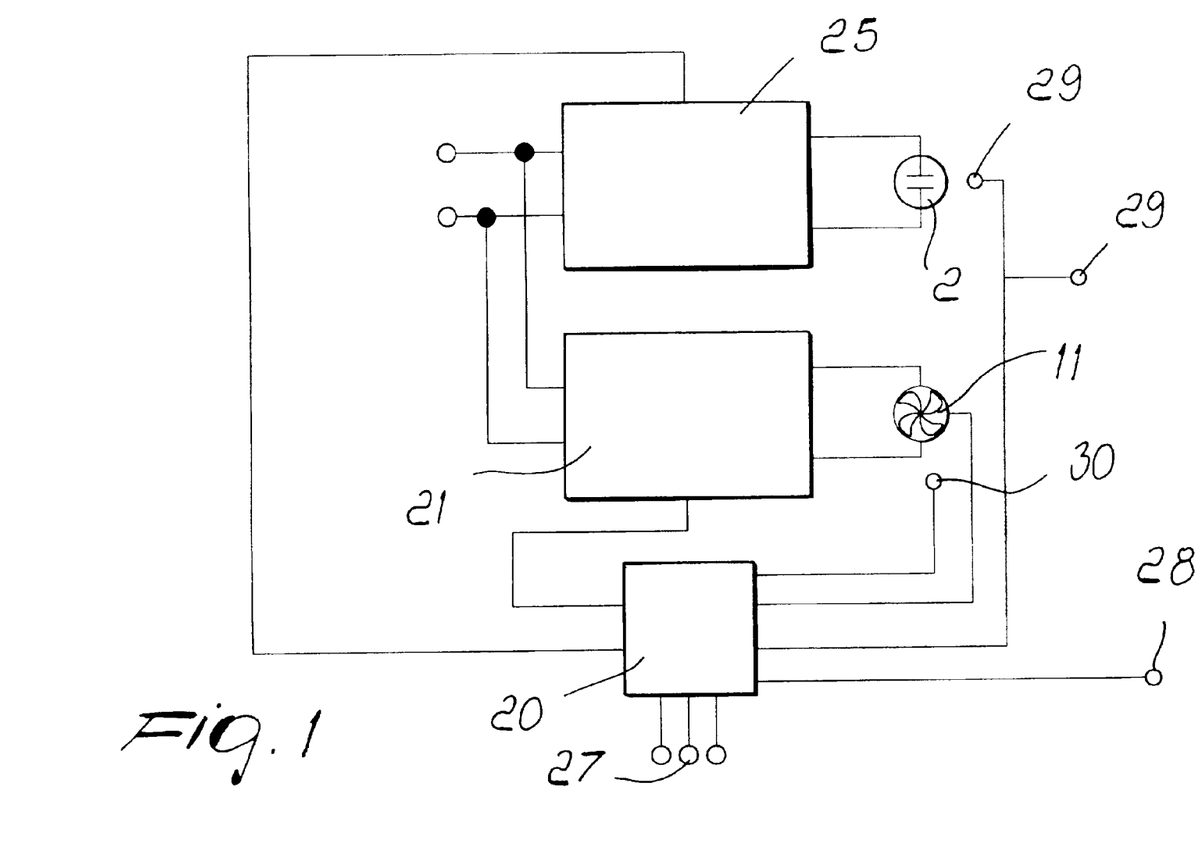
FIG. 1 is a block diagram of the lighting unit with ventilation control.
Figure 2:
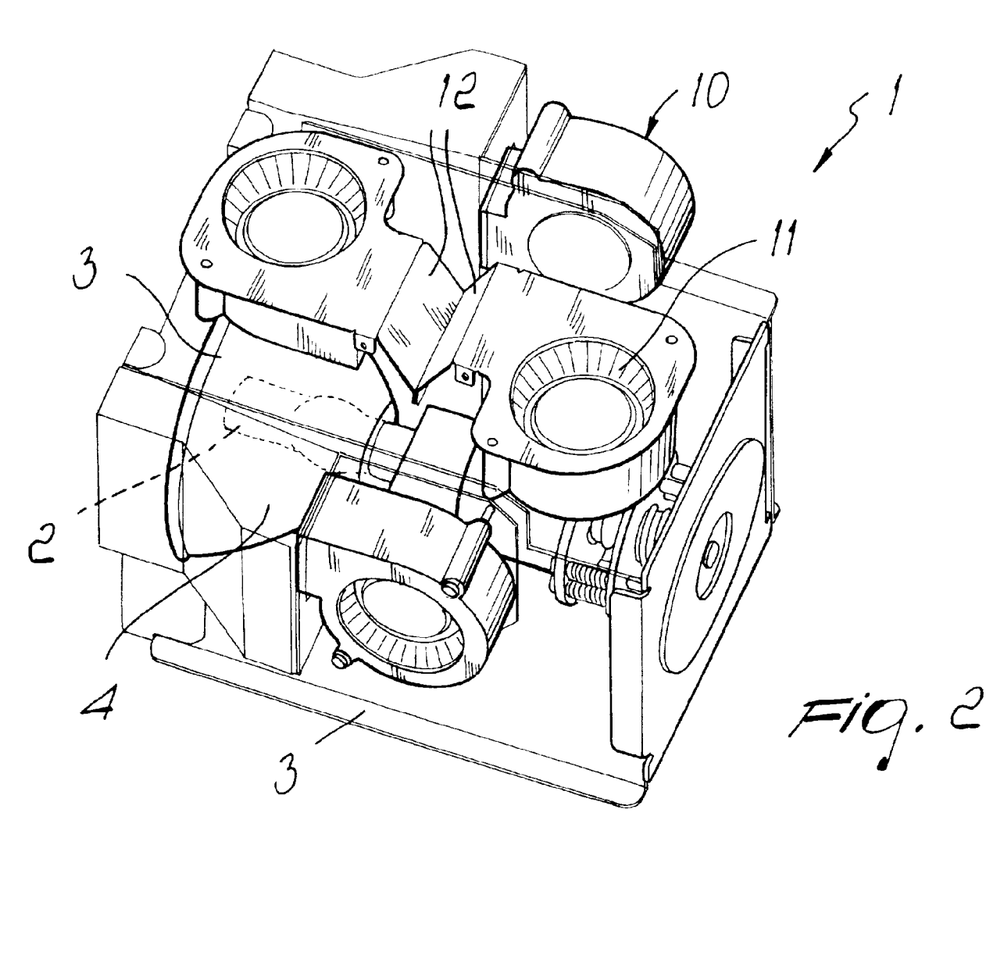
FIG. 2 is a schematic view of a lighting unit.

The particularity of the invention, as can be seen from the block diagram of FIG. 1, is constituted by the fact that there is a control unit 20, which drives a power supply for the fans 21 that allows to actuate the various ventilation elements at a variable speed.

Said fan power supply draws voltage from the mains and modulates it according to the requirements of use, as will become apparent hereinafter.

The control unit 20 also drives a lamp power supply 25, which allows to supply the lamp 2 with variable power levels, thus allowing to adjust the luminous intensity according to the specific requirements, always with the assurance of obtaining optimum cooling of the lamp, which in practice works at a constant temperature.

The control unit 20 is controlled by signals imparted from outside, generally designated by the reference numeral 27, and by signals 28 that originate from measurements taken inside the lighting unit.

The control unit is furthermore connected to a temperature sensor 29 and to a speed sensor for the fans 30.

In practice, the power supply 25, which is an electronic power supply, supplies the lamp with variable power levels, and the power variation is controlled by the external signal, i.e., directly by the user, who sets the intended power level, or by signals that can be derived from measurements taken inside the lighting unit, as better detailed hereinafter.

The power supply of the fans 21, which is also of the electronic type, thus supplies power to the individual fans with a variable speed, consequently obtaining a removal of heat that is a direct function of the generated heat.

The temperature sensors 29 and the speed sensor 30 in practice oversee the proper operation of the unit and allow to maintain a correct and constant temperature.

Moreover, the speed sensors 30, directly connected to the control unit 20, oversee the operation of the fans, generating messages related to correct operation and to alarms, which could switch off the lamp in case of danger.

If colored filters are inserted in the light beam, in addition to an increase in the temperature for the rays that are reflected on the lamp there is an increase in temperature that is contrasted by the intervention of the electronic power supply of the fans, which in practice provides compensation.

Moreover, there is an unavoidable loss of luminous output also at the output due to the filters that are inserted.

Figure 4:
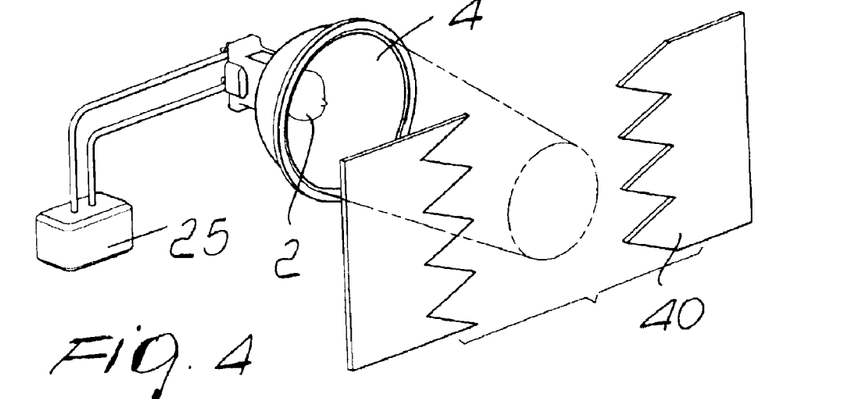
FIGS. 4, 5 and 6 are sequential views of the gradual insertion of a color filter.
Figure 5:
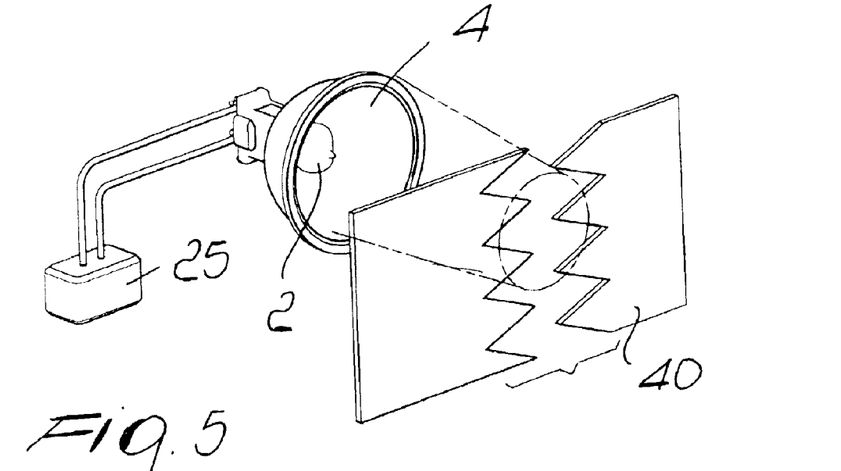
Figure 6:
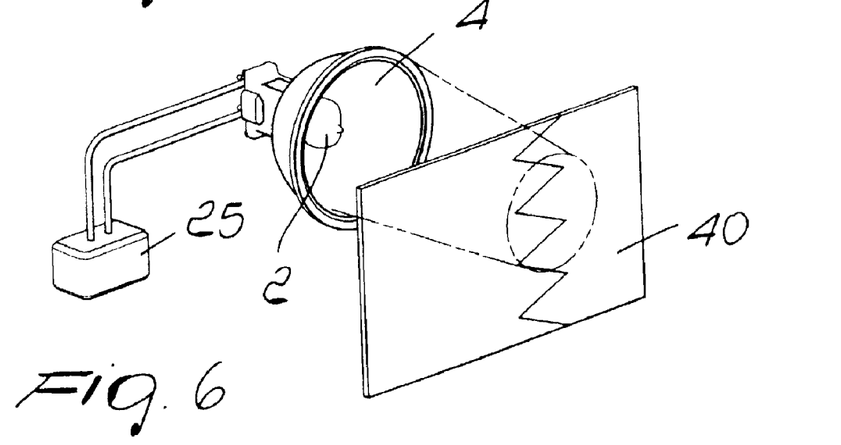
Figure 7:
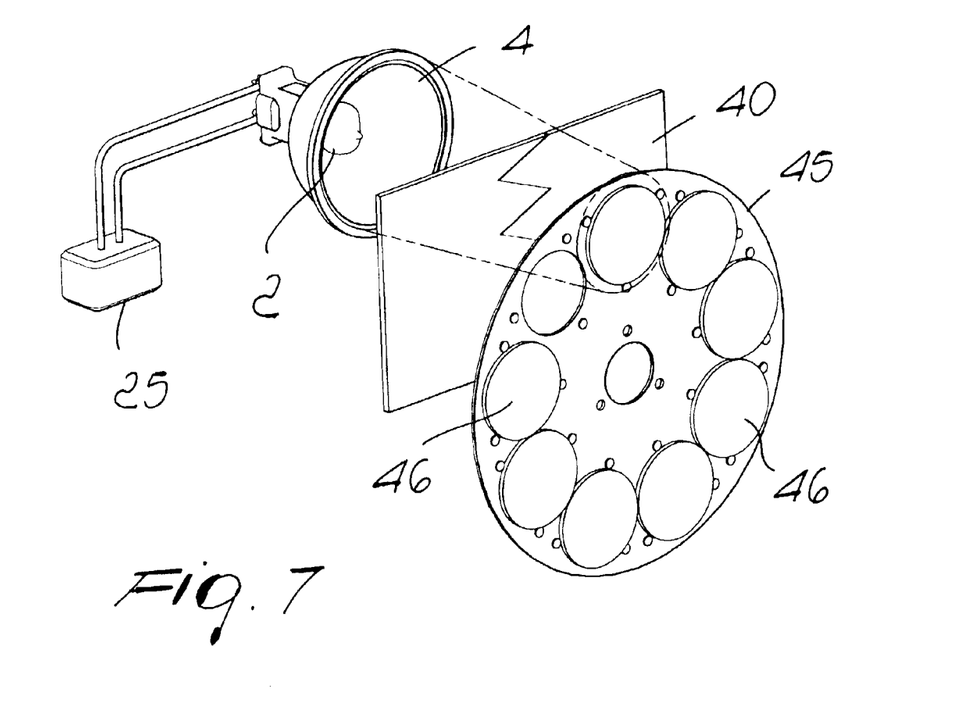
FIGS. 7 and 8 are views of the lighting unit, showing schematically the unit for the instantaneous insertion of a color filter.
Figure 8:
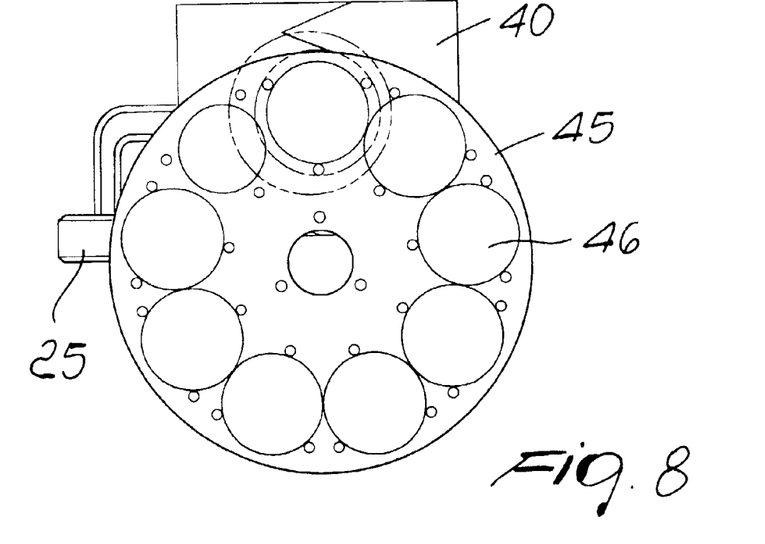
Figure 10:
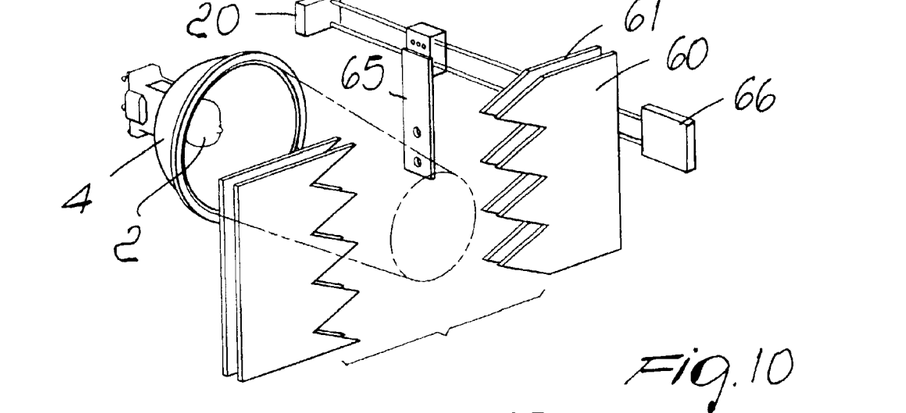
FIGS. 10, 11 and 12 are schematic sequential views of the step of the insertion of a color temperature correction filter.
Figure 11:
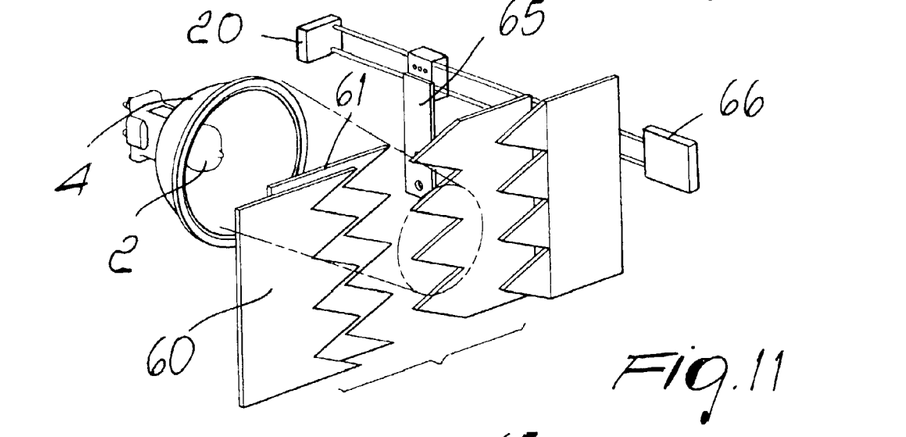
Figure 12:
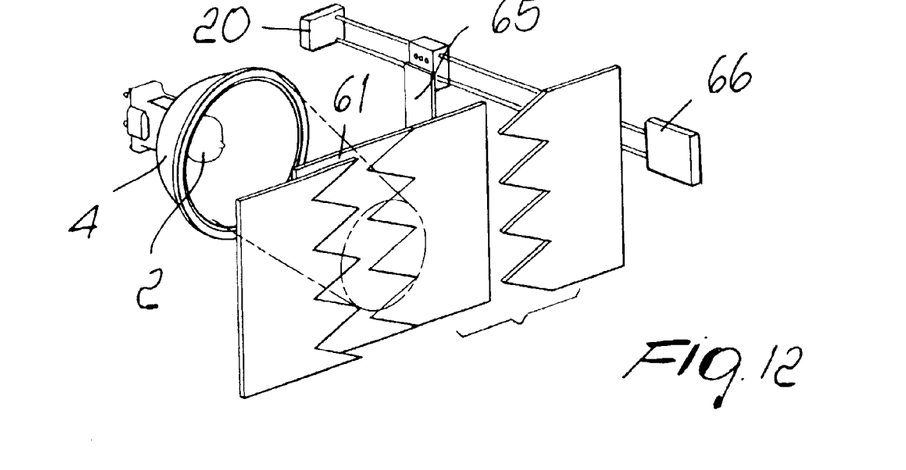

The filters can be of the gradual insertion type, such as the filters designated by the reference numeral 40 in FIGS. 4 to 6, in which the filter, by way of suitable motor means, is gradually inserted in the beam, or it is optionally possible to have filters with instantaneous insertion, which are provided for example on a wheel 45 that has a plurality of color filters 46 that are uniformly distributed circumferentially.

As mentioned, the insertion of the colored filters causes a decrease in luminous output.

Figure 3:
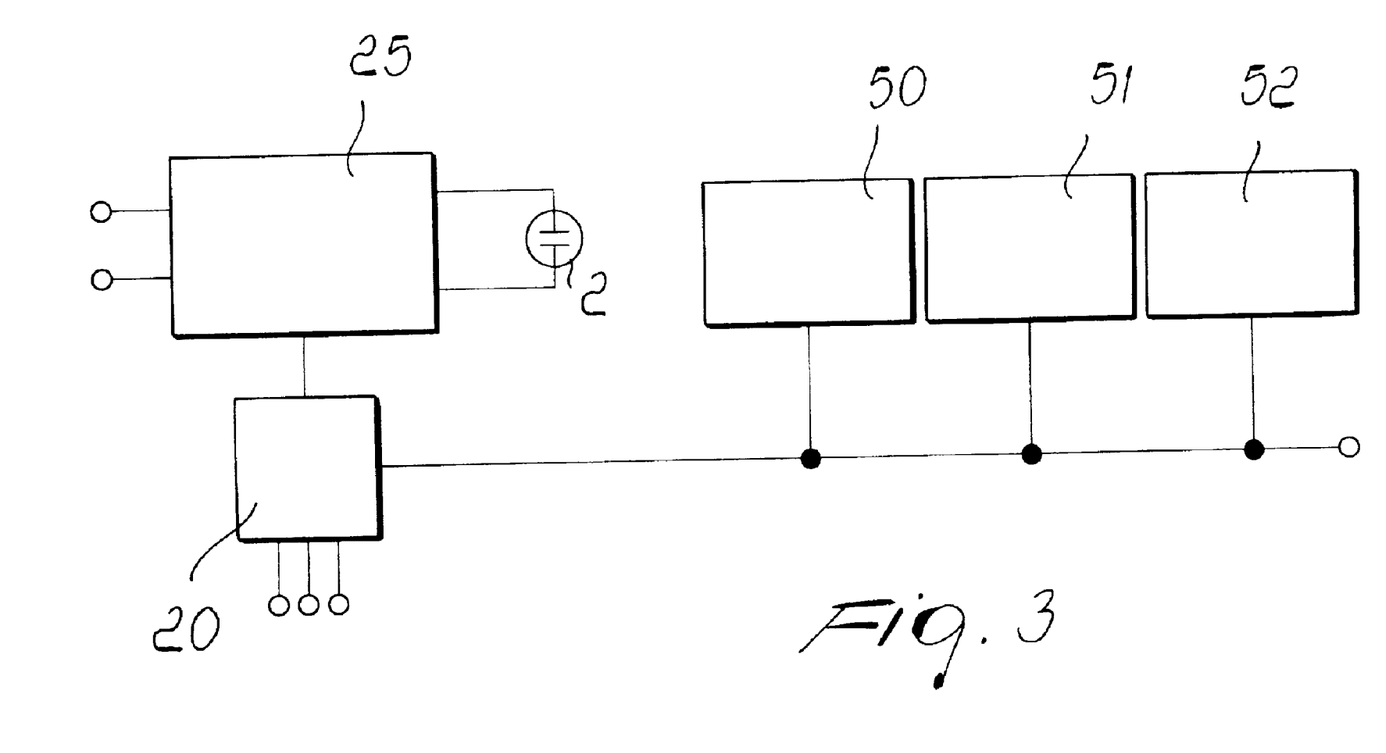
FIG. 3 is a block diagram of the power supply unit with lamp control according to the color filters that are inserted.

In the specific case, the control unit 20 is in controlled-controlling connection with the color filter drive motors, generally designated by the reference numerals 50, 51, 52, so as to obtain or be fed with a signal that indicates or triggers increasing of the power supplied to the lamp 2 according to the insertion of the filters.

At this point it should be noted that preferably, in normal operating conditions, when the lamp emits a white beam, the lamp is used substantially at 50% of its nominal power, and when the color filters are inserted the control unit directly drives the power supply 25 of the lamp so as to increase the power supplied and accordingly compensate for the luminous output loss.

In practice, the electronic power supply 25 compensates synchronously the reduction in luminous output from the spotlight by increasing proportionally the luminous output of the lamp.

In practical use, as mentioned, in normal operating conditions the lamp is lit to 50% of its nominal power to emit a beam of white light; when the color filter is inserted, for example by means of an external signal, the motor controlled by the filter actuation system places the suitable colored filter in the intended position and at the same time the power supply 25 automatically adapts the output of the lamp to a preset compensation value.

This power control allows to compensate automatically for the decrease in brightness that typically occurs when color filters are inserted in the beam of light.

FIGS. 9 to 12 illustrate another type of signal that can be derived from measurements taken inside the lighting unit, since the control unit is controlled by the signals originating from the motors 60 and 61 for actuating the color temperature correction filter and the temperature sensors 65 and 66 related to the various color temperatures considered are likewise connected to the control unit.

In this case also, therefore, any insertion of the color temperature correction filter causes an automatic variation in the power supplied to the lamp, which thus allows to emit externally a light beam whose intensity remains substantially constant and is compensated automatically according to the different type of color used.

From the above description it is thus evident that the invention achieves the intended aim and objects, and in particular the fact is stressed that the lighting unit according to the invention allows to provide, in a fully automated manner, both adjustment of the ventilation intensity of the lamps and variability of the luminous output according to the type of light beam emitted.

In the examples of embodiment cited above, the individual characteristics, given in relation to specific examples, may actually be interchanged with other different characteristics that exist in other examples of embodiment.

Moreover, it is noted that anything found to be already known during the patenting process is understood not to be claimed and to be deleted from the claims.

The invention thus conceived is susceptible of numerous modifications and variations, all of which are within the scope of the appended claims.

All the details may further be replaced with other technically equivalent elements.

In practice, the materials used, so long as they are compatible with a specific use, as well as the contingent shapes and dimensions, may be any according to requirements.

The disclosures in Italian Patent Application No. MI2002A001626 from which this application claims priority are incorporated herein by reference.

What is claimed is:

1. A lighting unit with discharge lamps for spotlights, comprising:
   a containment enclosure;
   at least one discharge lamp located inside said containment enclosure;
   at least one ventilation element arranged for directing a stream of air to said at least one discharge lamp for cooling said at least one discharge lamp;
   an electronic fan power supply configured for driving said at least one ventilation element at variable speed;
   an electronic lamp power supply configured for supplying said at least one discharge lamp with variable power levels;
   measurement signals derived from measurements of operating conditions inside and outside the lighting unit; and
   a control unit;
   said control unit being operatively connected to said fan power supply for selectively driving said fan power supply in order to actuate said at least one ventilation element at a variable speed and simultaneously said control unit being operatively connected to said lamp power supply for selectively driving said lamp power supply for supplying said at least one lamp with variable power, said control unit being controlled by said measurement signals.

2. The lighting unit of claim 1, further comprising a temperature sensor connected for signal transmission to said control unit.

3. The lighting unit of claim 2, further comprising a fan speed sensor connected for signal transmission to said control unit.

4. The lighting unit according to claim 1, further comprising: at least one filter that is insertable in an emitted light beam; and a motor for actuating said at least one color filter, said control unit being controlled by said motor.

5. The lighting unit of claim 4, wherein said lamp power supply has a power such as to compensate, under control of said control unit and synchronously with the insertion of said at least one filtering element, any reduction in luminous output of the spotlights.

6. The lighting unit according to claim 1, further comprising: at least one color temperature correction filter; a motor for actuating said color temperature correction filter; said control unit being connected with said motor for receiving signals indicating operating conditions therefrom.

7. The lighting unit of claim 6, further comprising temperature sensors for sensing operating conditions related to the various color temperatures being considered.

8. The lighting unit of claim 7, wherein in normal operating conditions said at least one lamp is lit at 50% of its nominal power.

* * * * *